United States Patent [19]

Fitzpatrick et al.

[11] Patent Number: 5,004,971
[45] Date of Patent: Apr. 2, 1991

[54] FLOATING TRANSISTOR SWITCH

[75] Inventors: Mark E. Fitzpatrick, San Jose; Robert C. Burd, Sunnyvale, both of Calif.

[73] Assignee: Gazelle Microcircuits, Inc., Santa Clara, Calif.

[21] Appl. No.: 505,858

[22] Filed: Apr. 5, 1990

[51] Int. Cl.⁵ .......................... G05F 1/46; G05F 3/08
[52] U.S. Cl. ................................. 323/312; 323/272; 323/317; 307/577
[58] Field of Search ............... 323/271, 272, 311, 312, 323/313, 314, 315, 316, 317; 307/571, 577, 584

[56] References Cited

U.S. PATENT DOCUMENTS

| | | | |
|---|---|---|---|
| 3,586,883 | 6/1971 | Hayes et al. | 307/577 |
| 3,819,952 | 6/1974 | Enomoto et al. | 307/577 |
| 4,571,536 | 2/1986 | Kuwahara | 323/313 |
| 4,686,387 | 8/1987 | Rumelhard | 323/315 |
| 4,866,301 | 9/1989 | Smith | 307/577 |

Primary Examiner—Peter S. Wong
Attorney, Agent, or Firm—Skjerven, Morrill, MacPherson, Franklin & Friel

[57] ABSTRACT

A switch means is disclosed which enables two or more terminals normally having a wide operating voltage to be connected by a pass transistor. A biasing means applies a voltage to the gate of the pass transistor which turns on the pass transistor without forward biasing any inherent diodes within the pass transistor.

15 Claims, 4 Drawing Sheets

FLOATING TRANSISTOR SWITCH

CROSS-REFERENCE TO RELATED APPLICATIONS

The following co-pending application is assigned to the same assignee of the present application and is related to the present application:

"Current Pump Structure" by Mark Fitzpatrick et al., filed concurrently herewith and assigned Ser. No. 07/506,418.

The above concurrently filed disclosure is incorporated herein by reference.

FIELD OF THE INVENTION

This invention relates to switches and in particular to a switch for making a connection between two nodes which may have a large operating voltage range.

BACKGROUND OF THE INVENTION

In certain applications, a switch is required to connect two or more nodes together where these nodes may assume a wide range of voltage levels. For example, with reference to FIG. 1, if switch SW1 is being used to intermittently connect current pump output terminal 20 to input terminal 22 of load 24, the voltage on driving terminal 20 or input terminal 22 may vary significantly between the power supply voltage and ground potential. Switch SW1 must be able to remain on or off over this wide range of voltages applied to its terminals.

If switch SW1 in FIG. 1 is a MOSFET with an insulated gate, shown as MOSFET 28 in FIG. 2, it is fairly simple to ensure the MOSFET 28 remains fully on or off, despite variations in voltage at terminals 20 and 22, by applying either the full power supply voltage or ground potential to its gate.

However, for switching devices which do not use an insulating gate, such as bipolar transistors or MESFETs, the base or gate of the pass transistor must not be driven to a level which causes the transistor's inherent diodes to conduct a significant amount of current. Therefore, the full power supply voltage cannot be simply applied to the base or noninsulated gate of the pass transistor for turning the transistor on.

Further, when turning the pass transistor off, it may not be desirable simply to apply ground potential to its base or gate, since the transistor may be adequately turned off by using a voltage higher than ground potential. By applying ground potential to the transistor's base or gate, unnecessary delay may be incurred when turning the transistor back on.

Thus, it would be desirable to provide a FET or bipolar switching device which will turn on and remain on despite variations in voltages at its nodes and which will not allow inherent diodes in the transistor to be forward biased. Further, it may be desirable to provide a FET or bipolar switching device which will turn off and remain off without applying an unnecessarily low voltage to its gate or base so as to avoid any unnecessary delay when the transistor is to be turned on.

Still further, it may be desirable to provide a switching device which will maintain a zero voltage differential between two nodes when the switch is open to prevent any current spikes resulting from a non-zero voltage differential between the two nodes when the switch is subsequently closed.

SUMMARY OF THE INVENTION

A novel switching device is disclosed herein which enables two or more terminals normally having a wide range of operating voltages to be connected, while avoiding the above-described problems with prior art switching devices.

In this novel switching device, a pass transistor has its current handling terminals coupled to nodes of switching device. The control terminal of the pass transistor is connected to a biasing means which senses the magnitude of the voltage applied to a first node of the switching device and applies a first voltage to the current control terminal of the pass transistor for turning the transistor on. The biasing means ensures that the voltage differential between the first node and the current control terminal will not forward bias inherent diodes in the pass transistor.

Further, the biasing means, when turning the transistor off, applies a second voltage to the current control terminal of the transistor which creates a predetermined voltage differential between the current control terminal and the first node necessary to turn the transistor off. This predetermined voltage differential is set so that unnecessary delay will not be incurred when the transistor is subsequently turned back on.

Further, in this novel switching device, while the switching device is open, a voltage is generated by a voltage controlled voltage source which corresponds to the voltage at the first node of the switching device. This generated voltage is then applied to a second node of the switching device, where the second node may be connected to some signal source operating in a high impedance mode. Hence, while the switching device is open, the first and second nodes of the switch means will be at the same voltage. Consequently, when the switch is closed, there will be no current surge caused by any voltage differential between the first and second nodes of the switch.

In a preferred embodiment, the voltage controlled voltage source provided by this novel switching device acts as a source while the switching device is in its open position so as to sink any leakage current from a signal source operating in a high impedance mode available at the second node of the switching device.

DETAILED DESCRIPTION OF THE PREFERRED EMBODIMENT

Figure 1:
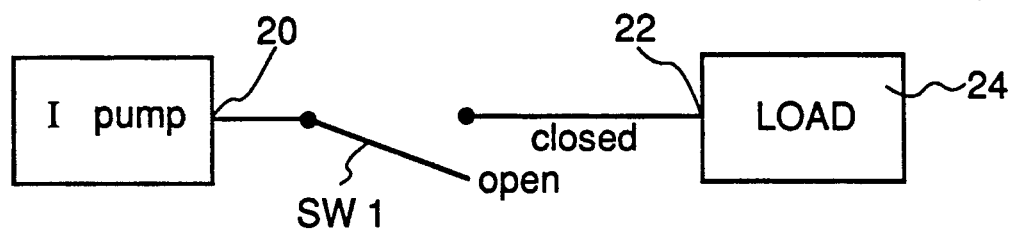
FIG. 1 shows a prior art circuit incorporating a switch to connect a signal source to a load.
Figure 2:
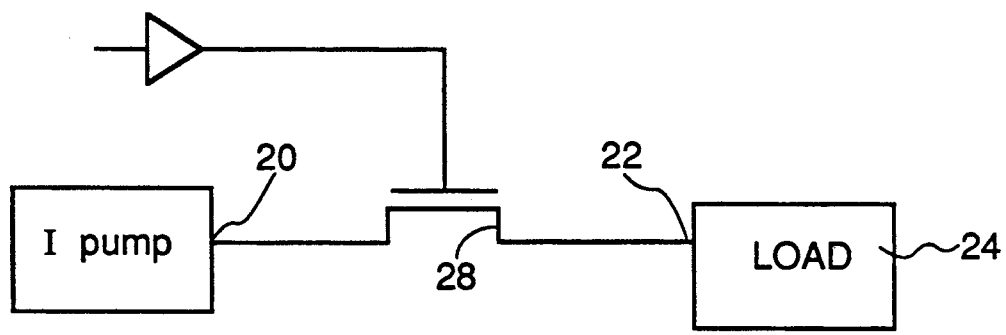
FIG. 2 shows a MOSFET being used as a pass transistor.
Figure 3:
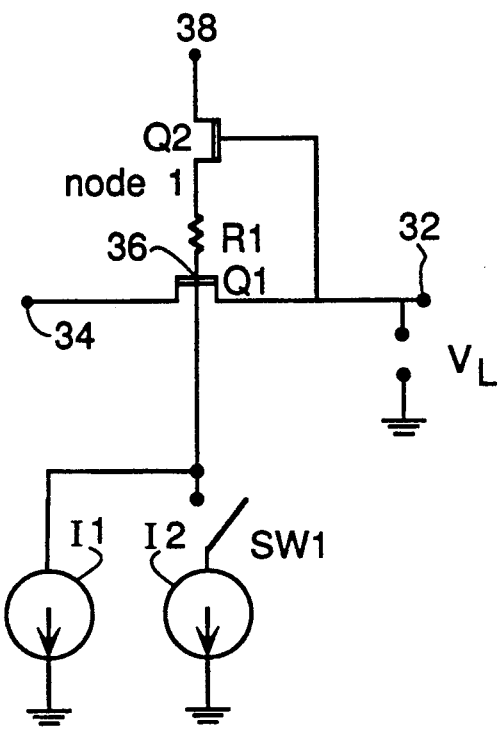
FIG. 3 shows one embodiment of the invention incorporating a gate biasing means.

FIG. 3 shows one embodiment of the inventive switching device, where a biasing means, comprising depletion mode transistor Q2, resistor R1, switch SW1, and current sources I1 and I2, is used to control the conductivity of pass transistor Q1.

Pass transistor Q1 in the embodiment shown in FIG. 3 is a MESFET; however, transistor Q1 may be any type of transistor. The circuit of FIG. 3 provides great utility if pass transistor Q1 does not have an insulated gate or is a bipolar transistor, since the biasing means is configured to ensure the inherent diodes in transistor Q1 are not forward biased.

The detailed construction and operation of the circuit of FIG. 3 follows.

In FIG. 3, depletion mode field effect transist Q1 has a first current handling terminal connected to terminal 32 of the switching device, while a second current handling terminal of transistor Q1 is connected to terminal 34. Terminal 32 may be connected to an input of a load while terminal 34 may be connected to an output of a signal generator, such as a current source or a voltage source. The conductivity of transistor Q1 is determined by whether the voltage at its gate 36 with respect to the voltages at either terminal 32 or 34 is more positive than its pinchoff voltage $V_p$. Pinchoff voltage $V_p$ is a negative gate-to-source ($V_{GS}$) of a value barely sufficient to render a depletion mode transitor nonconductive. Thus, causing the voltage at gate terminal 36 of transistor Q1 to be more positive than $V_p$ will render transistor Q1 conductive.

Depletion mode transistor Q2 has its drain coupled to positive power supply terminal 38 and its source (node 1) coupled to gate 36 of transistor Q1 through resistor R1. The gate of transistor Q2 is coupled to terminal 32, which will have some unknown load voltage $V_L$ applied to it. The voltage dropped across the gate/source ($V_{GS}$) of transistor Q2 will be the pinchoff voltage $V_p$ of transistor Q2. Thus, the voltage of node 1 (source of transistor Q2) will be equal to, $$V_L + |V_P|. \quad \text{Eq. 1}$$

Current source I1 is connected between gate 36 of transistor Q1 and ground, while current source I2 is connected via switch SW1 between gate 36 and ground. The value of resistor R1 and currents generated by current sources I1 and I2 are set so that, when switch SW1 is opened, the current generated by current source I1 allows a sufficiently high voltage to appear at gate 36 so as to render transistor Q1 conductive while also assuring that the inherent diodes within transistor Q1 do not become forward biased despite changes in voltage at terminal 32.

When switch SW1 is closed, the combined currents generated by current sources I1 and I2 cause the voltage at gate 36 to be sufficiently low so as to turn transistor Q1 off. Thus, when switch SW1 is closed, no current flows between terminals 32 and 34.

The equations used to set the value of resistor R1 and the currents generated by current sources I1 and I2 will be described later with respect to FIG. 5.

If the signal source coupled to terminal 34 has some current leakage when transistor Q1 is off and the signal source is operating in a high impedance mode, this may cause the voltage at terminal 34 to undesirably drift. If the voltage at terminal 34 drifts toward ground potential, the inherent diodes in transistor Q1 will undesirably turn on if the bias voltage applied to gate 36 exceeds the voltage at terminal 34 by approximately one diode drop. To prevent this from happening, a current source may be connected between a power supply terminal and terminal 34. The current source is configured to supply a slightly greater current than the anticipated leakage current of the signal source so the voltage at terminal 34 will necessarily drift up.

Figure 4:
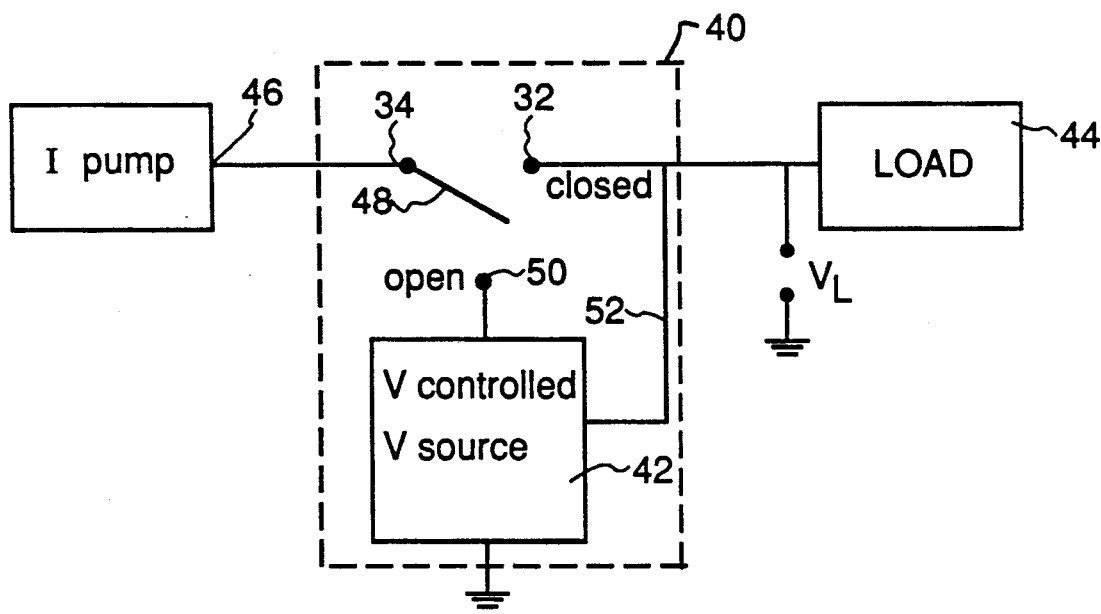
FIG. 4 shows one embodiment of the invention incorporating a voltage controlled voltage source.

FIG. 4 shows another embodiment of the inventive switching device represented within block 40 which is similar to that described with respect to FIG. 3 but which additionally includes voltage controlled voltage source 42. Also shown in FIG. 4 isload 44 having an input coupled to terminal 32 of switch 40. Coupled to terminal 34 of switch 40 is current pump 46. Current pump 46 may be any signal source.

Controllable conductor means 48 couples terminal 34 to either terminal 32 or to output terminal 50 of voltage source 42. An input of voltage source 42 is connected to terminal 32 via conductor 52.

While conductor 48 is closed, connecting terminal 32 to terminal 34, the voltage at terminal 34 is, of course, at approximately the same voltage as the voltage at terminal 32, which will be termed $V_L$.

When it is desired to disconnect terminal 32 from terminal 34, conductor means 48 is controlled to be in an open position and connect terminal 32 to terminal 50. Current pump 46 is now assumed to operate in a high impedance mode while conductor means 48 is in an open position. Voltage source 42 applies a voltage to terminal 50 approximately equal to the voltage $V_L$ on line 52 applied to a control terminal of voltage source 42. Thus, voltage source 42 causes the voltage at terminal 34 to be approximately equal to the voltage at terminal 32 when conductor means 48 is in an open position.

Ideally, the control terminal of voltage source 42 presents a very high impedance to load 44 so as not to draw significant current from load 44. Additionally, the output terminal 50 of voltage source 42 preferably provides a sufficient source to terminal 34 to sink any leakage currents at terminal 34 when conductor means 48 is in an open position.

In one application of switch means 40 shown in FIG. 4, switch means 40 is used in a phase-locked loop (PLL) circuit for intermittently connecting the output of current pump 46 to the input of load 44. The output of current pump 46 may be a positive current, a negative current, or a zero current. One embodiment of current pump 46 may be that described in the co-pending application identified in the Cross-Reference to Related Applications section. Load 44 may be a filter coupled to the input of a voltage controlled oscillator (VCO) whose input voltage corresponds to the frequency of the output of the VCO. A capacitor may be used as the filter so that a positive current applied to the input of the VCO causes a buildup of charge on the plates of the capacitor and causes an increase in voltage at the input of the VCO, increasing the frequency (or decreasing the frequency, depending on the VCO design) of its output. Conversely, a negative current generated by current source 46 would draw charge from the plates of the capacitor and lower the voltage at the input of VCO, lowering the frequency of its output. A zero current would ideally not change the voltage at the input of the VCO.

Typically, in a PLL, a single current pump cycle includes an inactive period and an active, or evaluation, period. In the evaluation period, the output frequency of the PLL is compared with a reference signal to determine any difference in phases of the two signals. In response to this difference, a positive, negative, or zero current is outputted by current pump 46 and applied to the input of the VCO to match the frequency of the output of the VCO with the reference signal. Thus, only during this evaluation cycle would switch 40 be in its closed position to connect the output of current pump 46 to the input of the VCO (load 44). During this brief evaluation period, the capacitor coupled to the input of the VCO is charged, discharged, or left alone as necessary. After this brief evaluation period, switch 40 is placed in its open state so as to avoid any leakage current from terminal 32 through current pump 46.

When the current pump 46 is in the inactive state, switch 40 is opened so that conductor means 48 connects terminal 32 to terminal 50. Voltage source 42 insures that terminal 34 is maintained at approximately the $V_L$ voltage level of terminal 32 during this inactive period. Thus, when conductor means 48 is again closed, no undesirable current surge as a result of voltage differentials on terminals 32 and 34 will result. Hence, only the current provided by current pump 46 during the evaluation period will affect the output frequency of the VCO (load 44).

Figure 5:
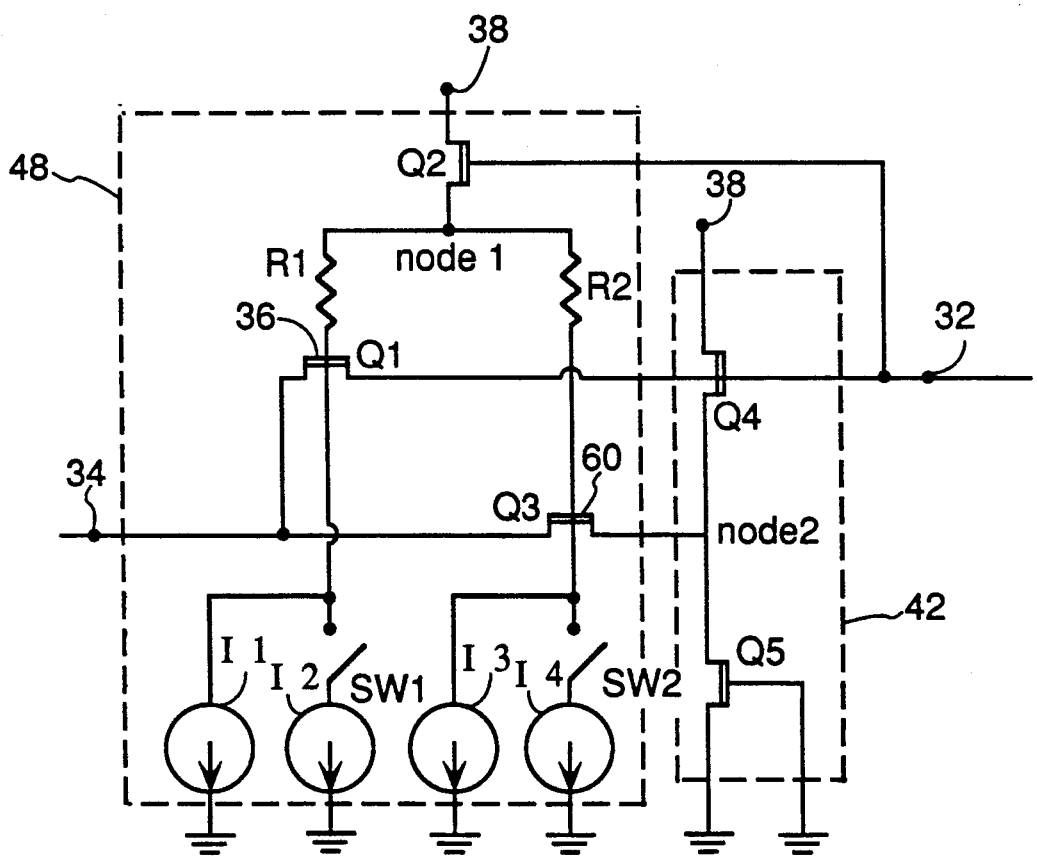
FIG. 5 shows one embodiment of a circuit used to implement the embodiments shown in FIG. 3 and 4.

FIG. 5 shows one embodiment of a circuit used to implement switch means 40 of FIG. 4. The portion of the circuit of FIG. 5 corresponding to voltage source 42 in FIG. 4 is shown within dashed lines identified by the numeral 42. The portion of the circuit of FIG. 5 corresponding to controllable conductor means 48 in FIG. 4 is shown within dashed lines identified by the numeral 48.

In FIG. 5, the portion of the circuit comprising transistors Q1 and Q2, resistor R1, switch SW1, and current sources I1 and I2 operate identically to those similarly labeled components in FIG. 3.

While transistor Q1 is off, in order to maintain a zero voltage differential between terminals 32 and 34, a voltage approximately equal to $V_L$ is coupled to terminal 34. Transistor Q3 helps provide this function, where gate 60 of transistor Q3 is coupled to node 1 via resistor R2. Current source I3 is coupled between gate 60 and ground, while current source I4 is coupled between gate 60 and ground via switch SW2.

In a preferred embodiment, resistors R1 and R2 are made to have the same value, transistors Q1 and Q3 are made to be identical, current sources I1 and I3 are made to be identical, and current sources I2 and I4 are made to be identical. The values of these various components are selected so that if switch SW2 is opened while switch SW1 is closed, a sufficiently high voltage will appear on gate 60 so as to render transistor Q3 conductive, while a sufficiently low voltage will appear on gate 36 so as to render transistor Q1 nonconductive.

Voltage source 42 comprising serially connected depletion mode transistors Q4 and Q5 is configured such that transistor Q4 is identical to transistor Q5. The gate of transistor Q5 is connected to ground along with its source so that the $V_{GS}$ of transistor Q5 is zero. The gate of transistor Q4 is coupled to terminal 32. Since the same current flows through transistors Q5 and Q4, both must have an essentially zero $V_{GS}$. Thus, the voltage at node 2 is approximately $V_L$.

Transistors Q4 and Q5 also act as sources to source and sink, respectively, leakage current from terminal 34 while trying to maintain terminal 34 at approximately $V_L$. The current maintained through transistors Q4 and Q5 is set sufficiently high to make any leakage current into or out of node 2 via terminal 34 insignificant so as to maintain the $V_{GS}$ of transistor Q4 at approximately zero.

Subsequently, when control signals are applied to switches SW1 and SW2 to open switch SW1 and simultaneously close switch SW2, transistor Q1 will be made conductive, while transistor Q3 will be made nonconductive. Since the voltage differential at terminals 32 and 34 is approximately zero, there will be no current surge through transistor Q1 due to any voltage differential between these terminals.

The following section relates to the settings of the various values of the resistors and currents used in FIGS. 3 and 5 to insure proper operation of the switching devices of FIGS. 3 and 5.

For either transistor Q1 or transistor Q3 to be made conductive, the voltage ($V_G$) applied to their respective gates must be greater than $V_L$ (applied to one terminal of both transistors Q1 and Q3) minus the $V_p$ of transistors Q1 and Q2, as given by the equation, $$V_G \geq V_L - |V_P|. \qquad \text{Eq. 2}$$

However, the voltage at the gates of transistors Q1 and Q3 must be kept below a certain voltage to insure that the inherent diodes within transistors Q1 and Q3 do not turn on. Thus, the voltage applied to their respective gates must be less than $V_L$ plus a diode drop, or that given by the equation, $$V_G < V_L + V_{diode}. \qquad \text{Eq. 3}$$

Thus, given a minimum gate voltage $V_G$ of eq. 2, and a maximum gate voltage $V_G$ of eq. 3, and given that $V_p$ approximately equals one diode drop, a safe voltage level for $V_G$ to turn transistors Q1 and Q3 on is given by the equation, $$V_G = V_L + (\tfrac{1}{2})|V_p|. \qquad \text{Eq. 4}$$

Given that
$$V_G = V_L + |V_p| - I1\,R1, \qquad \text{Eq. 5}$$

when switch SW1 is open, and by combining equations 4 and 5, the necessary gate voltages to be applied to the gates of transistors Q1 and Q3 require current sources I1 and I3 to generate the following current:

$$I1 = I3 = (\tfrac{1}{2})|V_p|/R1, \qquad \text{Eq. 6}$$

where R1 = R2, and the $V_p$ of transistors Q1 and Q3 are approximately equal.

To insure transistor Q1 is off when switch SW1 is closed, and to insure transistor Q3 is off when switch SW2 is closed, the following equation must be satisfied:

$$V_G < V_L - |V_p|. \qquad \text{Eq. 7}$$

To insure transistors Q1 and Q2 may be turned safely off, the gate voltage for providing this off state is set to:

$$V_G = V_L - 2.5|V_p|/R1, \qquad \text{Eq. 8}$$

Given that
$$V_G = V_L + |V_p| - (I1 + I2)R1, \qquad \text{Eq. 9}$$

when switch SW1 is closed, by using equations 8 and 9, the current generated by current sources I2 and I4 are thus set to be equal to, $$I2 = I4 = 2.8|V_p|/R1, \qquad \text{Eq. 10}$$

where R1 = R2, and $V_p$ is approximately equal for both transistor Q1 and Q3.

Figure 6:
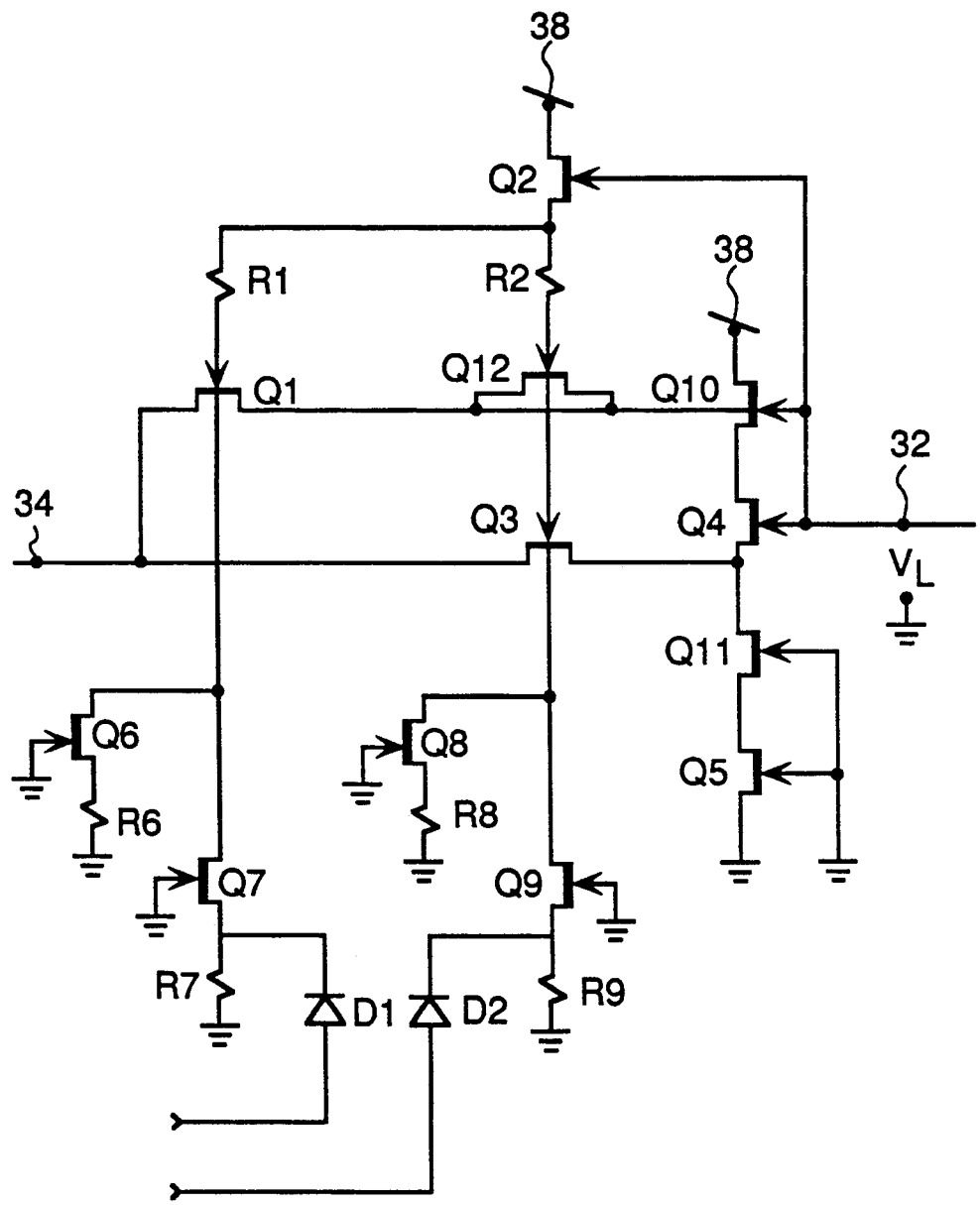
FIG. 6 shows an embodiment of an actual circuit used to implement the inventive switching device of FIG. 5.

FIG. 6 shows an actual circuit embodiment of the structure of FIG. 5 using depletion mode transistors. Transistors and resistors identified in FIG. 6 with the same nomenclature as transistors and resistors in FIG. 5 perform identical operations as the corresponding components in FIG. 5.

In FIG. 6, current source I1 of FIG. 5 comprises depletion mode transistor Q6 having its source coupled to ground via resistor R6 and its gate coupled to ground so that transistor Q6 pulls a constant current determined by the equation:

$$I1 = V_p/R6 \qquad \text{Eq. 11}$$

By combining equations 6 and 11, it is seen that $$R1/R6 = \text{?} \qquad \text{Eq. 12}$$

Current source I2 in FIG. 5 comprises transistor Q7 having its source coupled to ground via resistor R7 and having its gate coupled to ground so that transistor Q7 draws a constant current equal to $$I2 = V_p/R7 \qquad \text{Eq. 13}$$

when biased on.

By combining equations 10 and 13 it is seen that $$R7/R1 = 2.8 \qquad \text{Eq. 14}$$

Diode D1 has its cathode connected to the source of transistor Q7 and its anode coupled to receive a control voltage. When a control voltage is sufficiently high to bias diode D1 on and raise the source voltage of transistor Q7 to reduce the $V_{GS}$ of transistor Q7 to less than $V_p$, transistor Q7 will turn off.

Current source I3 in FIG. 5 comprises transistor Q8 having its source connected to ground via resistor R8 and its gate connected to ground so as to generate a current equal to $V_p/R8$.

Current source I4 in FIG. 5 comprises transistor Q9 having its source connected to ground via resistor R9 and its gate connected to ground so as to generate a current of $V_p/R9$ when biased in its on state. Switch SW2 of FIG. 5 comprises diode D2 having its cathode ccupled to the source of transistor Q9 and its anode coupled to receive a second control signal. The operation of diode D2 is similar to that of diode D1 to render transistor Q9 conductive or nonconductive.

With respect to the matching voltage source, shown in FIG. 5 as comprising transistors Q4 and Q5, transistors Q10 and Q11 have been added in the circuit shown in FIG. 6 to isolate the drains of transistors Q4 and Q5 from voltage fluctuations. Accordingly, any fluctuation in supply voltage applied to terminal 38 will cause very little change in the drain voltage of transistor Q4. Similarly, transistor Q11 prevents fluctuations in voltage $V_L$ from affecting the current generated by transistor Q5. Since transistors Q10 and Q11 are made to be identical, and transistors Q4 and Q5 are made to be identical, the $V_{GS}$ across transistor Q5 will be approximately the same as the $V_{GS}$ across transistor Q4. Since the $V_{GS}$ across transistor Q5 is zero, the voltage at the source of transistor Q4 will be equal to $V_L$.

Transistor Q12 is simply used to offset the parasitic capacitance of transistors Q1 and Q3 introduced when transistors Q1 and Q3 are switching.

The remainder of the circuit shown in FIG. 6 operates identically to the circuit shown in FIG. 5.

The circuits of FIGS. 3-6 may be implemented using any transistor technology, such as bipolar or field effect technology, and may be implemented using any semiconductor technology such as silicon or compound semiconductor technology.

The preferred embodiment of the present invention is constructed only of components commonly and currently available in GaAs or compound semiconductor technology. For example, the preferred embodiment of the invention does not depend on the use of insulated gas devices or other structures not easily manufacturable in GaAs.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A switch comprising:
   a first terminal;
   a second terminal;
   a first transistor having a first current handling terminal coupled to said first terminal and a second current handling terminal coupled to said second terminal, said first transistor having a current control terminal; and
   a first biasing means having an output terminal coupled to said current control terminal of said first transistor, said first biasing means having a control terminal coupled to said first terminal,
   said first biasing means being configured to generate a first voltage at said output terminal which creates a first predetermined voltage differential between said current control terminal of said first transistor and said first current handling terminal of said first transistor for turning on said first transistor despite variations in voltage at said first terminal,
   said first biasing means also being configured to generate a second voltage at said output terminal required to turn off said first transistor.

2. The switch of claim 1 wherein said first biasing means comprises:
   a first load means coupled between a first power supply terminal and said current control terminal of said first transistor; and
   a first controllable current source connected between said current control terminal of said first transistor and a second power supply terminal.

3. The switch of claim 2 further comprising a second transistor coupled between said first load means and said first power supply terminal, said second transistor having a current control terminal coupled to receive a voltage at said first terminal.

4. The switch of claim 3 wherein said first controllable current source comprises:
   a first current source connected between said current control terminal of said first transistor and said second power supply terminal; and
   a second current source having a first terminal connected to said current control terminal of said first transistor through a first switching means and having a second terminal coupled to said second power supply terminal.

5. The switch of claim 4 wherein said second current source comprises a depletion mode transistor having its gate coupled to its source through a resistor means, and wherein said first switching means comprises a diode having a first terminal coupled to a source of said depletion mode transistor and a second terminal coupled to receive a control signal.

6. The switch of claim 2 wherein said first transistor has a noninsulated gate.

7. The switch of claim 2 wherein said first transistor is a bipolar transistor.

8. The switch of claim 1 wherein said second voltage creates a second predetermined voltage differential between said current control terminal of said first transistor and said first current handling terminal of said first transistor required to turn off said first transistor.

9. The switch of claim 1 further comprising a voltage controlled voltage source for generating a voltage for application to said second terminal approximately equal to a voltage at said first terminal, said voltage source comprising:
- a current source connected so as to draw a fixed current; and
- a voltage source connected to said current source for supplying said fixed current, said voltage source having a current control terminal coupled to said first terminal such that a voltage on a common node of said current source and said voltage source will be approximately equal to a voltage at said first terminal.

10. The switch of claim 9 wherein said current source comprises a depletion mode transistor having a source coupled to a second power supply terminal and a gate coupled to its source, and wherein said voltage source comprises a second depletion mode transistor having its drain coupled to a first power supply terminal, having its source coupled to a drain of said first depletion mode transistor, and its gate coupled to said first terminal.

11. The switch of claim 10 wherein said common node is coupled to said second terminal through a second transistor, a current control terminal of said second transistor being connected to a second biasing means.

12. The switch of claim 11 wherein said second biasing means comprises:
- a first load means coupled between a first power supply terminal and said current control terminal of said second transistor; and
- a first controllable current source connected between said current control terminal of said second transistor and a second power supply terminal.

13. The switch of claim 12 further comprising a third transistor coupled between said first load means and said first power supply terminal, said third transistor having a current control terminal coupled to receive a voltage at said first terminal.

14. The switch of claim 13 wherein said first controllable current source comprises:
- a first current source connected between said current control terminal of said second transistor and said second power supply terminal; and
- a second current source having a first terminal connected to said current control terminal of said second transistor through a first switching means and having a second terminal coupled to said second power supply terminal.

15. The switch of claim 14 wherein said second current source comprises a depletion mode transistor having its gate coupled to its source through a resistor means, and wherein said first switching means comprises a diode having a first terminal coupled to a source of said depletion mode transistor and a second terminal coupled to receive a control signal.

* * * * *